United States Patent [19]
Muhich et al.

[11] Patent Number: 6,002,285
[45] Date of Patent: Dec. 14, 1999

[54] CIRCUITRY AND METHOD FOR LATCHING INFORMATION

[75] Inventors: John Stephen Muhich; Quan Nguyen, both of Austin, Tex.

[73] Assignee: International Business Machines Corporation, Armonk, N.Y.

[21] Appl. No.: 08/654,361

[22] Filed: May 28, 1996

[51] Int. Cl.[6] .................................................. H03K 3/356
[52] U.S. Cl. ........................... 327/208; 327/218; 327/212
[58] Field of Search ........................... 327/199, 200–203, 327/208–212, 214, 215, 218, 219, 170, 292; 377/70, 73, 74

[56] References Cited

U.S. PATENT DOCUMENTS

| 3,638,192 | 1/1972 | Rutherford et al. | 377/23 |
| 3,902,082 | 8/1975 | Proebsting et al. | 327/213 |
| 4,654,605 | 3/1987 | Lehmann et al. | 327/291 |
| 4,930,100 | 5/1990 | Morinaga et al. | 395/557 |
| 5,172,011 | 12/1992 | Leuthold et al. | 327/202 |
| 5,281,865 | 1/1994 | Yamashita et al. | 327/208 |
| 5,497,115 | 3/1996 | Millar et al. | 327/199 |
| 5,517,542 | 5/1996 | Huq | 327/212 |

FOREIGN PATENT DOCUMENTS

| 5-110387 | 4/1993 | Japan | 327/199 |
| 6-45879 | 2/1994 | Japan | 327/203 |

OTHER PUBLICATIONS

IBM Technical Disclosure Bulletin, "Delta–I Simultaneous Switching", vol. 27, No. 4A, Sep. 1984, pp. 2048–2053.

*Primary Examiner*—Timothy P. Callahan
*Assistant Examiner*—Eunja Shin
*Attorney, Agent, or Firm*—Casimer K. Salys

[57] ABSTRACT

An output signal is output to a selected one of first and second output nodes in response to an event in which a control node transitions from a first logic state to a second logic state. The selected one of the first and second output nodes is selected in response to a logic state of an input node during the event. A minimum setup time for the logic state of the input node to be stable before the control node transitions to the second logic state is shorter than a minimum time for inverting the logic state of the input node.

14 Claims, 4 Drawing Sheets

CIRCUITRY AND METHOD FOR LATCHING INFORMATION

TECHNICAL FIELD

This patent application relates in general to electronic circuitry and in particular to a method and circuitry for latching information.

BACKGROUND OF THE INVENTION

Microprocessors frequently include latch/register circuitry. With one type of latch/register circuitry, a pulse is output in response to a signal representative of information. Moreover, microprocessors are designed to operate at a specified clock frequency and clock cycle time. One goal of microprocessor design is to shorten the clock cycle time. But some previous latch/register circuitry imposes a significant amount of overhead delay, so the microprocessor's clock cycle time is lengthened.

Thus, a need has arisen for a method and circuitry for latching information, in which performance (e.g. shortening clock cycle times) is increased.

SUMMARY OF THE INVENTION

An output signal is output to a selected one of first and second output nodes in response to an event in which a control node transitions from a first logic state to a second logic state. The selected one of the first and second output nodes is selected in response to a logic state of an input node during the event. A minimum setup time for the logic state of the input node to be stable before the control node transitions to the second logic state is shorter than a minimum time for inverting the logic state of the input node.

It is a technical advantage of the present inventions that performance (e.g. shortening clock cycle times) is increased.

BRIEF DESCRIPTION OF THE DRAWINGS

An illustrative embodiment of the present inventions and their advantages are better understood by referring to the following descriptions and accompanying drawings, in which.

DETAILED DESCRIPTION

An illustrative embodiment of the present inventions and their advantages are better understood by referring to FIGS. 1–4 of the drawings, like numbers being used for like and corresponding parts of the accompanying drawings.

Figure 1:
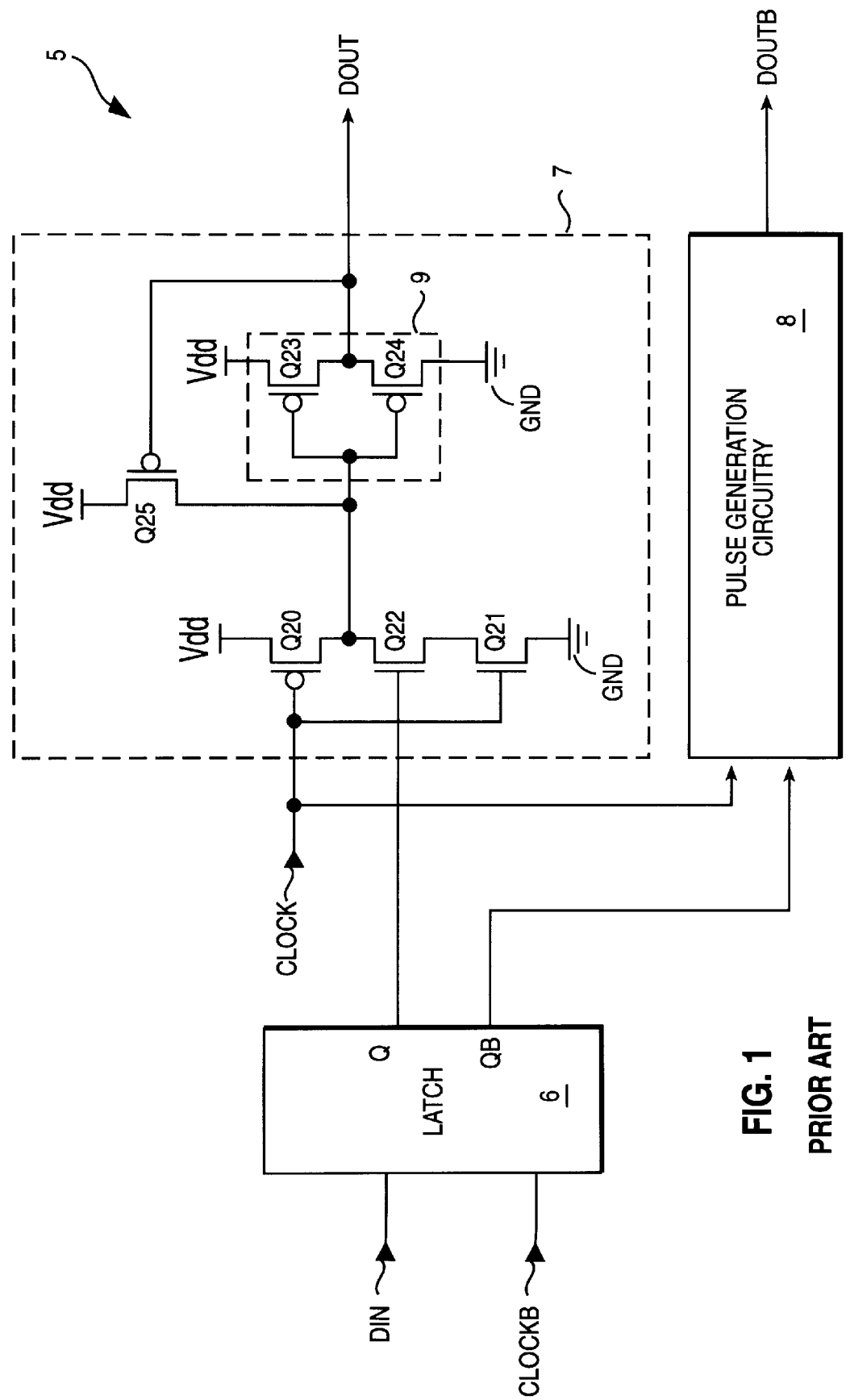
FIG. 1 is a schematic electrical circuit diagram of circuitry for latching information, according to the prior art.

FIG. 1 is a schematic electrical circuit diagram of circuitry, indicated generally at 5, for latching information, according to the prior art. As shown in FIG. 1, circuitry 5 includes a static latch 6, pulse generation circuitry indicated by dashed enclosure 7, and pulse generation circuitry 8. Circuitry 8 is identical in design to circuitry 7, except that circuitry 8 is connected to output node QB of latch 6 rather than output node Q of latch 6, and except that circuitry 8 outputs DOUTB rather than DOUT.

In circuitry 7, transistors Q23 and Q24 together form a complementary metal oxide semiconductor ("CMOS") inverter, indicated by dashed enclosure 9. Further, as shown in FIG. 1, transistors Q20, Q23 and Q25 are p channel field effect transistors ("FETs"), and transistors Q21, Q22 and Q24 are n channel FETs.

Circuitry 7 has two input nodes, namely (1) a clock input node CLOCK (i.e. a control node) for inputting a clock signal (i.e. a control signal) and (2) an information input node connected to Q for inputting a first information signal representative of binary information. Moreover, circuitry 7 has an information output node connected to DOUT for outputting a second information signal representative of binary information.

As shown in FIG. 1, CLOCK is connected to respective gates of transistors Q20 and Q21. Q is connected to a gate of transistor Q22. A voltage supply node Vdd is connected to respective sources of transistors Q20, Q25 and Q23. A voltage reference node GND is connected to respective sources of transistors Q21 and Q24.

A drain of transistor Q22 is connected to a drain of transistor Q20, to a drain of transistor Q25, and to respective gates of transistors Q23 and Q24. A drain of transistor Q21 is connected to a source of transistor Q22. A drain of transistor Q23 is connected to a drain of transistor Q24 and to a gate of transistor Q25. DOUT is connected to the gate of transistor Q25.

In the illustrative embodiment, Vdd has a voltage of approximately 3.3 volts relative to GND. Moreover, Vdd has a high voltage logic one (1) "true" state, and GND has a low voltage logic zero (0) "false" state. The gates of transistors Q23 and Q24 together form an input of inverter 9, and the drains of transistors Q23 and Q24 together form an output of inverter 9. It should also be noted that, in consideration of FET principles, a source of a FET may be referred to as a "source/drain", and likewise a drain of a FET may be referred to as a source/drain.

While CLOCK has a logic 0 state, DOUT has a logic 0 state, irrespective of Q's logic state, as:

1. transistor Q20 is substantially turned on, and transistor Q21 is substantially turned off, since CLOCK is connected to the respective gates of transistors Q20 and Q21;
2. the output of inverter 9 has a logic 0 state, since the input of inverter 9 is connected to the drain of transistor Q20;
3. DOUT is connected to the output of inverter 9; and
4. transistor Q25 is substantially turned on, since DOUT is connected to the gate of transistor Q25.

In response to CLOCK transitioning from a logic 0 state to a logic 1 state while Q has a logic 0 state, DOUT continues having a logic 0 state as:

1. transistor Q20 is substantially turned off, since CLOCK is connected to the gate of transistor Q20;
2. transistor Q22 is substantially turned off, since Q is connected to the gate of transistor Q22;
3. the output of inverter 9 continues having a logic 0 state, since the input of inverter 9 is connected to the drain of transistor Q25;
4. DOUT is connected to the output of inverter 9; and
5. transistor Q25 remains substantially turned on, since DOUT is connected to the gate of transistor Q25.

By comparison, in response to CLOCK transitioning from a logic 0 state to a logic 1 state while Q has a logic 1 state, DOUT transitions from a logic 0 state to a logic 1 state as:

1. transistor Q20 is substantially turned off, and transistor Q21 is substantially turned on, since CLOCK is connected to the respective gates of transistors Q20 and Q21;
2. transistor Q22 is substantially turned on, since Q is connected to the gate of transistor Q22;
3. the output of inverter 9 has a logic 1 state, since the input of inverter 9 is connected to the drain of transistor Q22;
4. DOUT is connected to the output of inverter 9; and
5. transistor Q25 is substantially turned off, since DOUT is connected to the gate of transistor Q25.

Likewise, with reference to circuitry 8, while CLOCK has a logic 0 state, DOUTB has a logic 0 state, irrespective of QB's logic state. In response to CLOCK transitioning from a logic 0 state to a logic 1 state while QB has a logic 0 state, DOUTB continues having a logic 0 state. By comparison, in response to CLOCK transitioning from a logic 0 state to a logic 1 state while QB has a logic 1 state, DOUTB transitions from a logic 0 state to a logic 1 state.

Figure 2:
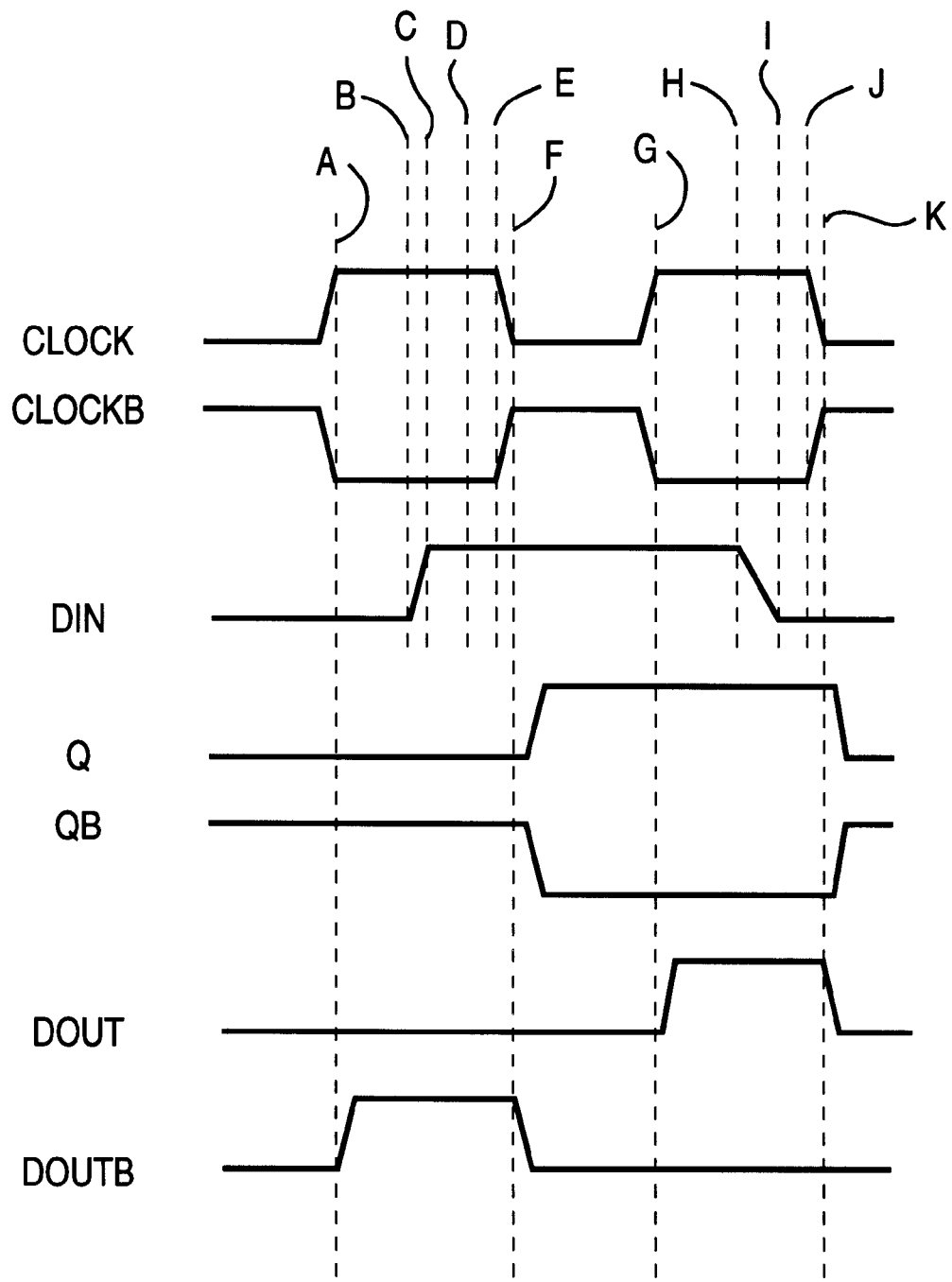
FIG. 2 is a timing diagram of the circuitry of FIG. 1 in operation.

FIG. 2 is a timing diagram of circuitry 5 in operation. Q and QB are both output from latch 6 in response to DIN and CLOCKB. As shown in FIG. 2, Q and QB are logically inverted from one another. Moreover, CLOCK and CLOCKB are logically inverted from one another.

At a time A, CLOCK transitions from a logic 0 state to a logic 1 state, Q has a logic 0 state, and QB has a logic 1 state. In response to such an event, DOUTB transitions from a logic 0 state to a logic 1 state, while DOUT remains at a logic 0 state.

At a time B, DIN begins to transition from a logic 0 state to a logic 1 state. Thus, START=B−A, where START is the time after A when DIN's logic state begins to transition. At a time C, DIN stops transitioning from a logic 0 state to a logic 1 state. Accordingly, RT=C−B, where RT is the rise time of DIN.

At a time E, CLOCKB begins to transition from a logic 0 state to a logic 1 state. In this example, SETUP=E−D, where SETUP is the minimum setup time for DIN's logic state to be stable at its connection to latch 6 before CLOCKB begins transitioning from a logic 0 state to a logic 1 state. Notably, a time gap exists between C and D, as will be discussed further hereinbelow.

At a time F, CLOCKB stops transitioning from a logic 0 state to a logic 1 state, and DIN has a logic 1 state. In response to such an event, Q transitions from a logic 0 state to a logic 1 state, and QB transitions from a logic 1 state to a logic 0 state.

At a time G, CLOCK transitions from a logic 0 state to a logic 1 state, Q has a logic 1 state, and QB has a logic 0 state. In response to such an event, DOUT transitions from a logic 0 state to a logic 1 state, while DOUTB remains at a logic 0 state.

At a time H, DIN begins to transition from a logic 1 state to a logic 0 state. Thus, START=H−G=B−A. At a time I, DIN stops transitioning from a logic 1 state to a logic 0 state. Accordingly, FT=I−H, where FT is the fall time of DIN. Notably, FT is significantly longer than RT.

At a time J, CLOCKB begins to transition from a logic 0 state to a logic 1 state. In this example, SETUP=J−I=E−D.

At a time K, CLOCKB stops transitioning from a logic 0 state to a logic 1 state, and DIN has a logic 0 state. In response to such an event, Q transitions from a logic 1 state to a logic 0 state, and QB transitions from a logic 0 state to a logic 1 state.

Accordingly, in response to DIN having a logic 1 state immediately prior to time F, circuitry 5 outputs a pulse signal at DOUT after time G, and such a pulse signal at DOUT has a pulse width approximately equal to a duration of CLOCK's logic 1 state. By comparison, if DIN had a logic 0 state immediately prior to time F, circuitry 5 would have output a pulse signal at DOUTB (rather than at DOUT) after time G, and once again such a pulse signal at DOUTB would have had a pulse width approximately equal to the duration of CLOCK's logic 1 state. In other words, after time G, circuitry 5 would have latched DOUTB's logic 1 state for approximately the duration of CLOCK's logic 1 state.

As previously mentioned, a time gap exists between C and D. This is because RT is significantly shorter than FT. It would be advantageous to reduce the time gap between C and D, as for example by reducing the cycle time of CLOCK. By reducing this cycle time, the frequency of CLOCK would be advantageously increased.

Nevertheless, circuitry 5 is unable to take advantage of the relatively short RT in such manner, because the cycle time of CLOCK (and hence also of CLOCKB) is constrained by the length of FT, as SETUP=J−I=E−D, and as FT=I−H. Thus, if the cycle time was reduced, circuitry 5 would fail to achieve the minimum setup time SETUP for DIN's logic state to be stable at its connection to latch 6 before CLOCKB begins transitioning from a logic 0 state to a logic 1 state at time J.

In consideration of CMOS inverter principles, an attempt to shorten FT would likely result in RT being increased, and vice versa. Hence, the shortest cycle time of CLOCK for circuitry 5 could be achieved if RT is increased (and likewise FT is shortened) until RT=FT, such that RT and FT are substantially "balanced". Nevertheless, since RT is increased under such a "balancing" technique, circuitry 5 by definition is unable to take advantage of the previously shorter RT.

Moreover, circuitry 5 also suffers from another shortcoming. More particularly, the speed at which circuitry 5 is able to discharge the input of inverter 9 is reduced by the fact that transistor Q21 is subject to the parasitic capacitance of transistor Q22, in addition to the parasitic capacitance of other circuitry (e.g. respective gates of transistors Q23 and Q24, and respective drains of transistors Q20 and Q25) directly connected to the input of inverter 9. This increases the time for circuitry 5 to completely transition DOUT's logic state in response to CLOCK transitioning from a logic 0 state to a logic 1 state.

In yet another shortcoming of circuitry 5, at least two CMOS inverter delay periods (i.e. the time required for a signal to propagate sequentially through two CMOS inverters connected in series to one another) occur before latch 6 completely transitions Q's and QB's logic states in response to CLOCKB transitioning from a logic 0 state to a logic 1 state. Further, two CMOS inverter delay periods occur before circuitry 7 completely transitions DOUT's logic state in response to CLOCK transitioning from a logic 0 state to a logic 1 state. Accordingly, more than four CMOS inverter delay periods occur before circuitry 5 completely transitions DOUT's logic state, following a transition of DIN from a logic 0 state to a logic 1 state.

In an alternative to circuitry 5 of FIG. 1, latch 6 is eliminated, the gate of transistor Q22 is connected directly to DIN rather than Q, circuitry 8 is connected directly to an output of a CMOS inverter (not shown) rather than QB, and an input of such a CMOS inverter is connected directly to DIN. A shortcoming of such an alternative is that a minimum setup time for the logic state of DIN to be stable before CLOCK transitions to a logic 1 state is at least one CMOS inverter delay period (i.e. a minimum time for the CMOS inverter, through which DIN is coupled to circuitry 8, to invert the logic state of DIN). Such a delay period is unacceptable for many electronic integrated circuitry applications.

Figure 3:
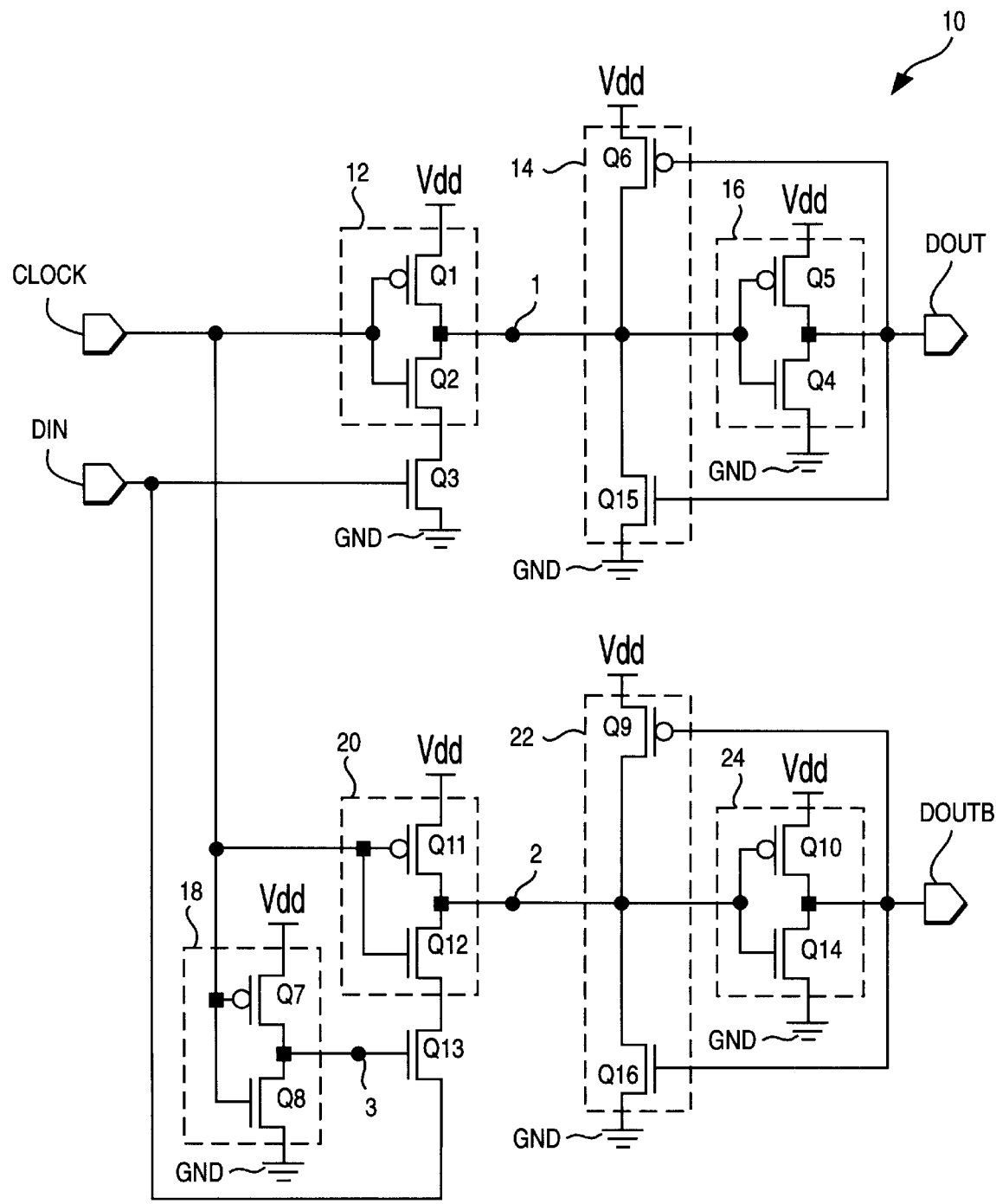
FIG. 3 is a schematic electrical circuit diagram of circuitry for latching information, according to the illustrative embodiment.

FIG. 3 is a schematic electrical circuit diagram of circuitry, indicated generally at 10, for latching information, according to the illustrative embodiment. As shown in FIG. 3, channel width-to-length ratios of the various transistors are set forth in the Appendix.

Transistors Q1 and Q2 together form a CMOS inverter, indicated by dashed enclosure 12. Also, transistors Q6 and Q15 together form a CMOS inverter, indicated by dashed enclosure 14. Further, transistors Q4 and Q5 together form a CMOS inverter, indicated by dashed enclosure 16. Moreover, transistors Q7 and Q8 together form a CMOS inverter, indicated by dashed enclosure 18. In addition, transistors Q11 and Q12 together form a CMOS inverter, indicated by dashed enclosure 20. Similarly, transistors Q9 and Q16 together form a CMOS inverter, indicated by dashed enclosure 22. Finally, transistors Q10 and Q14 together form a CMOS inverter, indicated by dashed enclosure 24.

Also, as shown in FIG. 3, transistors Q1, Q5, Q6, Q7, Q9, Q10 and Q11 are p channel FETs, and transistors Q2, Q3, Q4, Q8, Q12, Q13, Q14, Q15 and Q16 are n channel FETs.

Circuitry 10 has two input nodes, namely (1) a clock input node CLOCK (i.e. a control node) for inputting (i.e. receiving) a clock signal (i.e. a control signal) and (2) an information input node DIN for inputting an information input signal representative of binary information. Moreover, circuitry 10 has two output nodes, namely (1) an information output node DOUT for outputting a first information output signal representative of binary information and (2) an information output node DOUTB for outputting a second information output signal representative of binary information.

As shown in FIG. 3, CLOCK is connected to respective inputs of inverters 12, 18 and 20. DIN is connected to a gate of transistor Q3 and to a source of transistor Q13. A voltage supply node Vdd is connected to respective sources of transistors Q1, Q5, Q6, Q7, Q9, Q10 and Q11. A voltage reference node GND is connected to respective sources of transistors Q3, Q4, Q8, Q14, Q15 and Q16. A drain of transistor Q3 is connected to a source of transistor Q2 (i.e. to a voltage reference input of inverter 12), and a drain of transistor Q13 is connected to a source of transistor Q12 (i.e. to a voltage reference input of inverter 20).

An output of inverter 18 is connected to a gate of transistor Q13 An output of inverter 12 is connected to an input of inverter 16 and to an output of inverter 14. An output of inverter 16 is connected to an input of inverter 14 and to DOUT. Similarly, an output of inverter 20 is connected to an input of inverter 24 and to an output of inverter 22. An output of inverter 24 is connected to an input of inverter 22 and to DOUTB.

In the illustrative embodiment, Vdd has a voltage of approximately 3.3 volts relative to GND. Moreover, Vdd has a high voltage logic one (1) "true" state, and GND has a low voltage logic zero (0) "false" state.

Inverters 14 and 16 are "back to back" inverters which positively "feedback" to one another and accordingly operate as a latch, because:

1. the output of inverter 14 is connected to the input of inverter 16; and
2. the output of inverter 16 is connected to the input of inverter 14.

Likewise, inverters 22 and 24 are "back to back" inverters which positively "feedback" to one another and accordingly operate as a latch, because:

1. the output of inverter 22 is connected to the input of inverter 24; and
2. the output of inverter 24 is connected to the input of inverter 22.

The output of inverter 12 is connected to a node 1, and the output of inverter 20 is connected to a node 2. Further, the output of inverter 18 is connected to a node 3.

Figure 4:
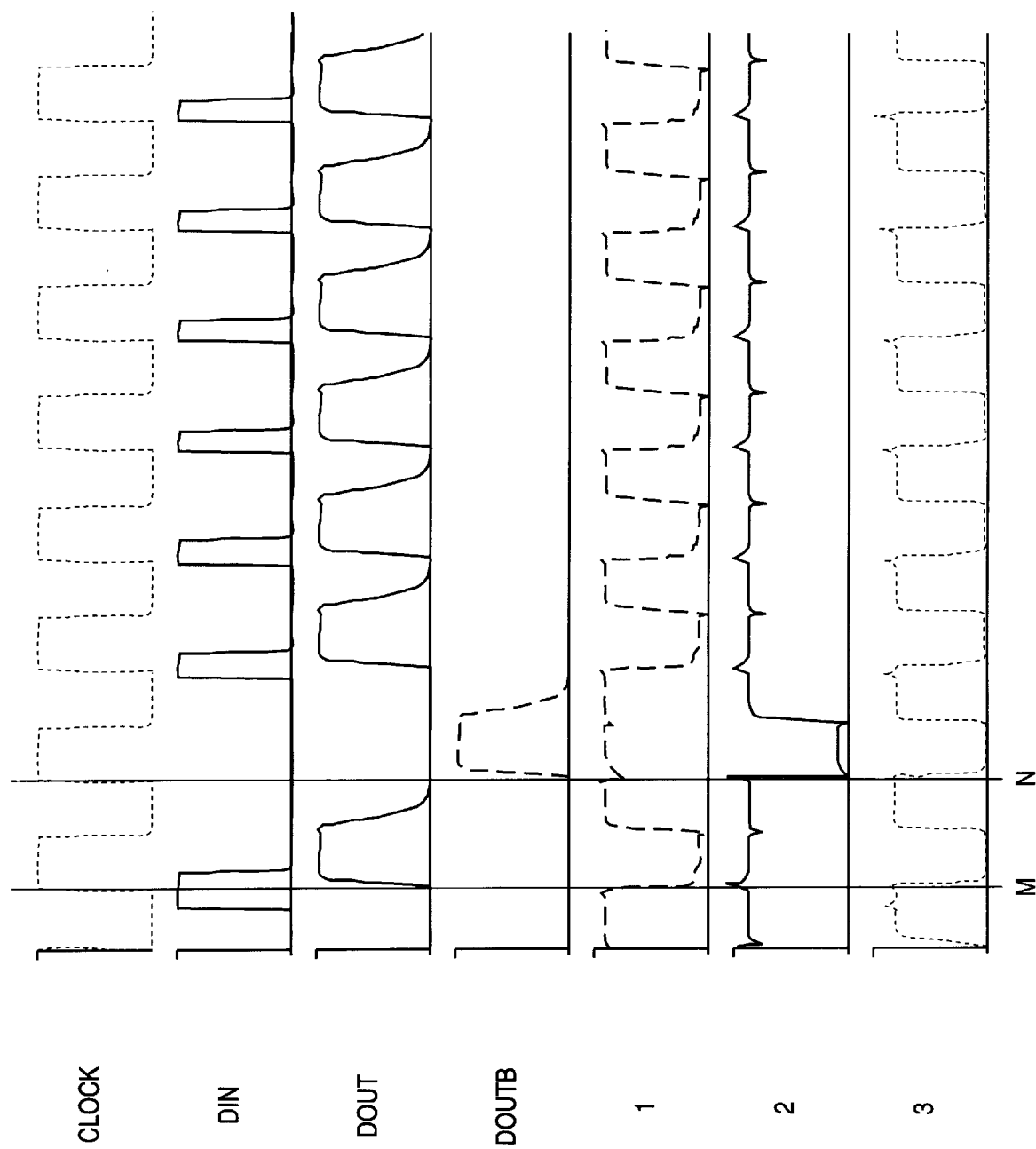
FIG. 4 is a timing diagram of the circuitry of FIG. 3 in operation.

FIG. 4 is a timing diagram of circuitry 10 in operation. More particularly, FIG. 4 shows logic states of CLOCK, DIN, DOUT, DOUTB, and nodes 1, 2 and 3, at various points in time during the operation of circuitry 10. Referring simultaneously to FIGS. 3 and 4, prior to a time M, CLOCK has a logic 0 state, and each of DOUT and DOUTB has a logic 0 state as:

1. each of the respective outputs of inverters 12 and 20 has a logic 1 state, since the respective inputs of inverters 12 and 20 are connected to CLOCK;
2. each of the respective outputs of inverters 16 and 24 has a logic 0 state, since the input of inverter 16 is connected to the output of inverter 12, and since the input of inverter 24 is connected to the output of inverter 20; and
3. DOUT is connected to the output of inverter 16, and DOUTB is connected to the output of inverter 24.

Thus, DOUT and DOUTB are precharged to a logic 0 state in response to CLOCK having a logic 0 state.

At a time M, CLOCK transitions from a logic 0 state to a logic 1 state while DIN has a logic 1 state. In response to such an event, DOUT transitions from a logic 0 state to a logic 1 state as:

1. the output of inverter 12 transitions to a logic 0 state, since:
   (a) transistor Q3 is substantially turned on because the gate of transistor Q3 is connected to DIN; and
   (b) transistor Q2 is substantially turned on because the gate of transistor Q2 is connected to CLOCK;
2. the output of inverter 16 has a logic 1 state, since the input of inverter 16 is connected to the output of inverter 12; and
3. DOUT is connected to the output of inverter 16.

Further, in response to CLOCK transitioning (at time M) from a logic 0 state to a logic 1 state while DIN has a logic 1 state, "back to back" inverters 22 and 24 continue latching the previous logic 0 state at DOUTB as:

1. transistor Q13 is substantially turned off, since the source of transistor Q13 is connected to DIN; and
2. transistor Q11 is substantially turned off, since the gate of transistor Q11 is connected to CLOCK.

Moreover, after time M, even as DIN later transitions from a logic 1 state to a logic 0 state, "back to back" inverters 14 and 16 continue latching the new logic 1 state at DOUT as:

1. transistor Q3 is substantially turned off, since the gate of transistor Q3 is connected to DIN; and
2. transistor Q1 is substantially turned off, since the gate of transistor Q1 is connected to CLOCK.

Accordingly, in response to CLOCK transitioning from a logic 0 state to a logic 1 state at time M, the logic state of DIN is "sampled" so that DOUT (rather than DOUTB) has a logic 1 state after time M, irrespective of whether DIN's logic state changes shortly after time M. In this manner, information represented by DIN's logic state is "transferred" from DIN to DOUT.

After time M, yet before a time N, CLOCK transitions from a logic 1 state to a logic 0 state. This occurs one-half clock cycle after time M. In response to such an event, DOUT transitions from a logic 1 state to a logic 0 state as:

1. the output of inverter 12 transitions to a logic 1 state, since the input of inverter 12 is connected to CLOCK;
2. the output of inverter 16 transitions to a logic 0 state, since the input of inverter 16 is connected to the output of inverter 12; and
3. DOUT is connected to the output of inverter 16.

Thus, circuitry 10 is a "pulse-input" latch, because DIN's logic state is a pulse (i.e. "pulse-input") substantially centered around time M. Also, circuitry 10 is a "pulse-output" latch, because DOUT's logic state is a pulse (i.e. "pulse-output"). Accordingly, in response to DIN having a logic 1 state immediately prior to time M, circuitry 10 outputs a pulse signal at DOUT (rather than at DOUTB) after time M, and such a pulse signal at DOUT has a pulse width approximately equal to a duration of CLOCK's logic 1 state. In other words, after time M, circuitry 10 latches DOUT's logic 1 state for approximately the duration of CLOCK's logic 1 state.

At time N, CLOCK transitions from a logic 0 state to a logic 1 state while DIN has a logic 0 state. In response to such an event, DOUTB transitions from a logic 0 state to a logic 1 state as:

1. the output of inverter 20 transitions to a logic 0 state, since:
   (a) the previous logic 1 state of node 3 continues for one inverter delay period (i.e. the time required for the clock signal at CLOCK to propagate through inverter 18) after CLOCK transitions (at time N) to a logic 1 state; and
   (b) transistor Q13 is substantially turned on during the one inverter delay period (during which the previous logic 1 state of node 3 continues) as:
      (i) the gate of transistor Q13 is connected to node 3 (i.e. to the output of inverter 18); and
      (ii) the source of transistor Q13 is connected to DIN which has a logic 0 state;
   (c) transistor Q12 is substantially turned on because the gate of transistor Q12 is connected to CLOCK;
2. the output of inverter 24 has a logic 1 state, since the input of inverter 24 is connected to the output of inverter 20; and
3. DOUTB is connected to the output of inverter 24.

After CLOCK transitions (at time N) to a logic 1 state, the time allowed for the output of inverter 20 to completely transition to a logic 0 state is substantially equal to the time during which transistors Q12 and Q13 are substantially turned on, and consequently such time is substantially equal to the inverter delay period of inverter 18 (i.e. the time required for the clock signal at CLOCK to propagate through inverter 18).

Therefore, with respect to DOUTB, the minimum hold period of DIN after CLOCK transitions to a logic 1 state is substantially equal to the inverter delay period of inverter 18. For example, in order to ensure proper operation of circuitry 10, if the inverter delay period of inverter 18 increases, then so does the minimum hold period of DIN after CLOCK transitions to a logic 1 state. Likewise, if the inverter delay period of inverter 18 decreases, then so does the minimum hold period of DIN after CLOCK transitions to a logic 1 state, at least with respect to DOUTB.

However, with respect to DOUT, if CLOCK transitions from a logic 0 state to a logic 1 state while DIN has a logic 0 state, then in order to ensure proper operation of DOUT, the minimum hold period of DIN at the logic 0 state is substantially equal to the period during which CLOCK continues having the logic 1 state. Otherwise, if DIN transitioned from the logic 0 state to a logic 1 state while CLOCK continued having the logic 1 state, then both transistors Q2 and Q3 would be substantially turned on, and DOUT would improperly transition from a logic 0 state to a logic 1 state.

Nevertheless, by comparison, if CLOCK transitions from a logic 0 state to a logic 1 state while DIN has a logic 1 state, then the minimum hold period of DIN at the logic 1 state is substantially equal to the inverter delay period of inverter 18 (which of course is significantly shorter than the period during which CLOCK continues having the logic 1 state). Notably, with respect to circuitry 10, it is preferable if attempts can be made to shorten the rise time RT of DIN without regard to the possible result of fall time FT being increased. In such a manner, the shortest cycle time of CLOCK for circuitry 10 could be achieved if RT is shortened without regard to whether RT=FT (i.e. without regard to whether RT and FT are substantially "balanced").

In consideration of the preference to shorten RT, it is noteworthy that the minimum hold period of DIN at the logic 1 state for circuitry 10 is the relatively short inverter delay period (approximately) of inverter 18. Without negatively impacting the operation of circuitry 10, DIN is free to more quickly initiate transitioning to a logic 0 state immediately upon expiration of this relatively short minimum hold period. Advantageously, if DIN more quickly initiates transitioning to a logic 0 state, circuitry 10 is able to substantially avoid the potential negative consequence of a longer FT. By comparison, the minimum hold period of DIN at the logic 0 state is longer (i.e. the period during which CLOCK continues having the logic 1 state) and thereby delays DIN's ability to initiate transitioning to a logic 1 state, but there is little (if any) negative consequence on circuitry 10 because it is preferable anyway (as stated hereinabove) to shorten RT.

Accordingly, if the minimum hold period of DIN at the logic 0 state is satisfied with respect to DOUT, then in response to CLOCK transitioning (at time N) from a logic 0 state to a logic 1 state while DIN has a logic 0 state, "back to back" inverters 14 and 16 continue latching the previous logic 0 state at DOUT as:

1. transistor Q3 is substantially turned off, since the gate of transistor Q3 is connected to DIN; and
2. transistor Q1 is substantially turned off, since the gate of transistor Q1 is connected to CLOCK.

With respect to DOUTB, after the one inverter delay period (during which the previous logic 1 state of node 3 continued), the clock signal at CLOCK will have propagated through inverter 18 after CLOCK transitioned (at time N) to a logic 1 state. Consequently, even if DIN later transitions from a logic 0 state to a logic 1 state, "back to back" inverters 22 and 24 continue latching the new logic 1 state at DOUTB as:

1. transistor Q13 is substantially turned off, since the gate of transistor Q13 is connected to node 3 (i.e. to the output of inverter 18); and
2. transistor Q11 is substantially turned off, since the gate of transistor Q11 is connected to CLOCK.

Accordingly, in response to CLOCK transitioning from a logic 0 state to a logic 1 state at time N, the logic state of DIN is "sampled" so that DOUTB (rather than DOUT) has a logic 1 state after time N, irrespective of whether DIN's logic state changes shortly after time N. In this manner, information represented by DIN's logic state is "transferred" from DIN to DOUTB.

One-half clock cycle after time N, CLOCK transitions from a logic 1 state to a logic 0 state. In response to such an event, DOUTB transitions from a logic 1 state to a logic 0 state as:

1. the output of inverter 20 transitions to a logic 1 state, since the input of inverter 20 is connected to CLOCK;
2. the output of inverter 24 transitions to a logic 0 state, since the input of inverter 24 is connected to the output of inverter 20; and
3. DOUTB is connected to the output of inverter 24.

Thus, circuitry 10 is a "pulse-output" latch, because DOUTB's logic state is a pulse (i.e. "pulse-output"). Accordingly, in response to DIN having a logic 0 state immediately prior to time N, circuitry 10 outputs a pulse signal at DOUTB (rather than at DOUT) after time N, and such a pulse signal at DOUTB has a pulse width approximately equal to the duration of CLOCK's logic 1 state. In other words, after time N, circuitry 10 latches DOUTB's logic 1 state for approximately the duration of CLOCK's logic 1 state.

Since circuitry 10 outputs only a pulse signal at either DOUT or DOUTB only in response to CLOCK transitioning from a logic 0 state to a logic 1 state, circuitry 10 is a "non-transparent" dual-output orthogonal "pulse-input"/"pulse-output" latch. As discussed hereinabove, in response to a logic state of DIN during the event in which CLOCK transitions from a logic 0 state to a logic 1 state, circuitry 10 selects one of DOUT and DOUTB at which to output such a pulse signal.

Circuitry 10 (FIG. 3) achieves significant technical advantages and overcomes shortcomings of circuitry 5 (FIG. 1). For example, the fall time FT of DIN is not a significant factor in the design of circuitry 10. Thus, with respect to circuitry 10, and even in consideration of CMOS inverter principles, attempts can be made to shorten the rise time RT of DIN without regard to the possible result of FT being increased. Hence, the shortest cycle time of CLOCK for circuitry 10 could be achieved if RT is shortened without regard to whether RT=FT (i.e. without regard to whether RT and FT are substantially "balanced"). Accordingly, since circuitry 10 not subject to such a "balancing" requirement, circuitry 10 is more able than circuitry 5 to take advantage of a shorter RT, in order to reduce DIN's minimum setup time before CLOCK transitions to a logic 1 state.

Moreover, as discussed hereinabove in connection with FIG. 1 and the alternative to circuitry 5, a shortcoming of such an alternative is that DIN's minimum setup time before CLOCK transitions to a logic 1 state is at least one CMOS inverter delay period (i.e. a minimum time for the CMOS inverter, through which DIN is coupled to circuitry 8, to invert the logic state of DIN). Such a delay period is unacceptable for many electronic integrated circuitry applications. By comparison, circuitry 10 operates advantageously without generating a logical inverse of DIN's logic state. Thus, with circuitry 10, DIN's minimum setup time before CLOCK transitions to a logic 1 state is significantly shorter than a minimum time for inverting DIN's logic state. In other words, advantageously with circuitry 10, DIN's minimum setup time is significantly shorter than one CMOS inverter delay period. By reducing DIN's minimum setup time, the cycle time of CLOCK can be reduced, and the frequency of CLOCK can be advantageously increased.

In another technical advantage, the speed at which circuitry 10 is able to discharge the input of inverter 16 (or the input of inverter 24) is increased by at least approximately 20% relative to the speed at which circuitry 5 is able to discharge the input of inverter 9. This is attributable, at least in part, for example, to the fact that transistor Q2 in operation is not appreciably subject to parasitic capacitance of transistor Q3. Similarly, transistor Q12 in operation is not appreciably subject to parasitic capacitance of transistor Q13.

More particularly, circuitry 10 is implemented so that, in operation, DIN's logic state is adequately setup in advance of CLOCK transitioning from a logic 0 state to a logic 1 state. Consequently, in such a situation, the drain of transistor Q3 (or the drain of transistor Q13) is precharged to a logic 0 state in advance of CLOCK transitioning to the logic 1 state. By precharging the drain of transistor Q3 (or the drain of transistor Q13) to a logic 0 state, transistor Q2 is not appreciably subject to parasitic capacitance of transistor Q3 if transistor Q2 is substantially turned on in response to CLOCK's logic 1 state, and transistor Q12 is not appreciably subject to parasitic capacitance of transistor Q13 if transistor Q12 is substantially turned on in response to CLOCK's logic 1 state. Relative to circuitry 5, this advantageously reduces the time for circuitry 10 to completely transition DOUT's logic state (or DOUTB's logic state) in response to CLOCK transitioning from a logic 0 state to a logic 1 state.

In yet another technical advantage of circuitry 10, only slightly more than two CMOS inverter delay periods occur before circuitry 10 completely transitions DOUT's logic state (or DOUTB's logic state), following a transition of DIN from a logic 0 state to a logic 1 state. This compares very favorably relative to circuitry 5, in which more than four CMOS inverter delay periods occur before circuitry 5 completely transitions DOUT's logic state, following a transition of DIN from a logic 0 state to a logic 1 state.

Although an illustrative embodiment of the present inventions and their advantages have been described in detail herein, it has been described as example and not as limitation. Various changes, substitutions and alterations can be made in the illustrative embodiment without departing from the breadth, scope and spirit of the present inventions. The breadth, scope and spirit of the present inventions should not be limited by the illustrative embodiment, but should be defined only in accordance with the claims and equivalents thereof.

APPENDIX

| Transistor | Channel Width-to-Length Ratio ("R") |
| --- | --- |
| Q1 | 7/2 |
| Q2 | 15/2 |
| Q3 | 22/2 |
| Q4 | 4 |
| Q5 | 24/3 |
| Q6 | 2 |
| Q7 | 12 |
| Q8 | 4 |
| Q9 | 2 |
| Q10 | 24/3 |
| Q11 | 7/2 |
| Q12 | 15/2 |
| Q13 | 22/2 |
| Q14 | 4 |
| Q15 | 1 |
| Q16 | 1 |

Note: Illustrative channel length is 0.5 micron. Where R is expressed as an M/N ratio, the transistor is physically implemented as N number of transistors connected to one another in parallel (i.e. the N transistors' sources are connected to one another, the N transistors' drains are connected to one another, and the N transistors' gates are connected to one another), and each of the N transistors has an individual channel width-to-length ratio of R=M/N. For example, transistor Q2 (for which R=M/N=15/2 as shown above) is physically implemented as 2 transistors connected to one another in parallel, and each of the 2 transistors has an individual channel width-to-length ratio of 7.5.

What is claimed is:

1. Clock synchronized latch circuitry, comprising:

a control node;

only a single input node;

first and second output nodes;

first circuitry means coupled to said control node, to said input node, and to said first and second output nodes, for outputting an output signal to one of said first or second output nodes, in response to an event in which a signal on said control node transitions from a first logic state to a second logic state, as determined by a logic state signal on said input node during said event; and second circuitry means coupled to said first circuitry means operable to provide a minimum setup time for said logic state signal on said input node, before said control node signal transitions to said second logic state, shorter than a minimum time for said second output node to respond to a selected logic state on said input node.

2. The circuitry of claim 1 and comprising circuitry for latching said output signal at said one of said first or second output nodes in response to said event and until said control node signal transitions from said second logic state to said first logic state.

3. The circuitry of claim 1 and comprising circuitry for precharging said first and second output nodes to a predetermined logic state in response to said control node signal having said first logic state.

4. Circuitry, comprising:

a control node;

an input node;

first, second and third inverters each comprising a respective input and a respective output, said respective inputs being coupled to said control node;

a first output node coupled to said output of said first inverter;

a second output node coupled to said output of said second inverter;

a first transistor having;

a gate coupled to said input node; and a source/drain coupled to a voltage node of said first inverter;

a second transistor having;

a gate coupled to said output of said third inverter;

a first source/drain coupled to a voltage node of said second inverter; and a second source/drain coupled to said input node; and wherein the circuitry outputs an output signal to a selected one of said first and second output nodes in response to an event in which said control node transitions from a first logic state to a second logic state.

5. The circuitry of claim 4 wherein said selected one of said first and second output nodes is selected in response to a logic state of said input node during said event.

6. The circuitry of claim 4 wherein a minimum setup time for said logic state signal on said input node, before said control node signal transitions to said second logic state, is shorter than a minimum time for said second output node to respond to a selected logic state on said input node.

7. The circuitry of claim 4 wherein said one of said first or second output nodes is selected in response to a logic state signal on said input node during said event, and wherein a minimum setup time for said logic state signal on said input node, before said control node signal transitions to said second logic state, is shorter than a minimum time for said second output node to respond to a selected logic state on said input node.

8. The circuitry of claim 4 wherein said transistors are field effect transistors.

9. The circuitry of claim 8 wherein said inverters are complementary metal oxide semiconductor inverters.

10. The circuitry of claim 4 and comprising first and second latches coupled to said first and second output nodes, respectively.

11. The circuitry of claim 10 wherein each of said latches comprises a respective pair of inverters, wherein a first member of said pair has:

an output coupled to an input of a second member of said pair; and an input coupled to an output of said second member of said pair.

12. A method of operating clock synchronized latch circuitry, comprising the steps of:

enabling a selected one of first or second output nodes in response to a logic state of only a single input node of said circuitry during an event;

outputting an output signal to the selected one of first or second output nodes of said circuitry in response to said event in which a control node of said circuitry transitions from a first logic state to a second logic state; and generating said logic state signal on said input node with a minimum setup time before said control node signal transitions to said second logic state shorter than a minimum time for said second output node to respond to a selected logic state on said input node.

13. The method of claim 12 and comprising the further step of:

latching said output signal at said one of said first or second output nodes in response to said event until said control node signal transitions from said second logic state to said first logic state.

14. The method of claim 12 and comprising:

precharging said first and second output nodes to a predetermined logic state in response to said control node signal having said first logic state.

* * * * *